May 29, 1956 R. C. INGRAHAM 2,748,326
SEMICONDUCTOR TRANSLATORS AND PROCESSING
Filed March 28, 1950

INVENTOR
ROBERT C. INGRAHAM
BY Paul S. Martin
ATTORNEY

United States Patent Office 2,748,326

Patented May 29, 1956

2,748,326

SEMICONDUCTOR TRANSLATORS AND PROCESSING

Robert C. Ingraham, Boston, Mass., assignor to Sylvania Electric Products Inc., a corporation of Massachusetts Application March 28, 1950, Serial No. 152,418

6 Claims. (Cl. 317—236)

This invention relates to the processing of diodes and other semiconductor translators and transducers, and to such electrical devices as products.

In a typical crystal diode as one form of semiconductor translator, a point-contact element as of pointed tungsten wire is pressed resiliently against a chip of purified and advantageously tin-doped germanium. This chip is taken from an ingot sliced into slabs and diced into chips, the surface of each slab being polished and etched. The germanium chip or "crystal" is soldered to the end of a metal pin, customarily using a corrosive chloride flux. The mounting pin may be of brass or of nickel and advantageously the surface of the germanium that is to be soldered to the pin is plated with copper in a preliminary operation to facilitate soldering.

After soldering the mounted crystal has heretofore been washed thoroughly by boiling in distilled water, air-dried and mounted in a cartridge with the catwhisker resiliently pressed against the germanium surface. The whisker is then advantageously pulsed electrically to enhance the rectification characteristics.

In routine manufacture of such germanium diodes there will naturally be a certain percentage of mechanically defective units (due for example to improperly shaped catwhiskers) and electrically defective units (due to imperfectly prepared ingots). In one aspect, the present invention is concerned with improved methods of handling and treating the semiconductor component in the manufacture of diodes and multi-whisker translators, particularly those using germanium as the semiconductor, for improved quality and percentage yield. A further object is the provision of germanium units of improved stability.

In preparing mounted germanium chips for assembly in diodes and other translators, two steps are used both of which are regarded necessary in practicing an important aspect of this invention. First, the crystal is etched after being mounted, and second, the mounted crystal is dehydrated as in a prolonged vacuum baking cycle. Dehydration can be accomplished effectively by other means, as by soaking in acetone, but baking is preferred because it avoids the possibility of contamination due to impurities in the soaking bath.

I have discovered that when both the step of etching after mounting and the step of baking the mounted germanium are used, that the yield of acceptable units is vastly increased and their quality is improved. In one instance of comparative tests on a commercial scale a reduction of loss-of-yield of 60% was realized through introduction of the etch-after-mount and dehydration steps. Neither step alone achieves noteworthy gain.

Semiconductor devices have for many years been made with enclosures formed in such a way as to be moderately airtight, but for protection against atmospheric attack on the surface of the semiconductor a fill as of wax has been used to cover the semiconductor and the contacting catwhisker. When a vitreous envelope as disclosed and claimed in copending application Serial No. 74,768, filed February 5, 1949, by Ralph B. Collins now Patent No. 2,697,805, issued December 21, 1954, was produced in which (see also application Serial No. 85,518, filed April 5, 1949, by Paul E. Gates, now Patent No. 2,697,309, issued December 21, 1954) the semiconductor and contacting catwhisker were hermetically enclosed, it has been found that loss of units after prolonged storage is very low despite the limited volume of enclosed atmosphere due to the absence of a fill. In commercial practice such units are hermetically sealed by soldering the leads for the elements through metal envelope fittings. A possible explanation for the improvement is that the final etching and dehydrating steps leave the semiconductor surface substantially free of ionizable salts, and of the moisture required for ionization of salt traces. The etching bath seems to be effective to undercut surface foreign particles adhering to the semiconductor and to react with relatively insoluble surface impurities, such as that deposited in a zinc chloride fluxing and soldering operation advantageously used in mounting the crystals.

Despite these precautions and the hermetically sealed envelope, there are still occasional units good when made, but which fail with shelf-life. This may be due to occasional spatter of flux used in soldering the leads into the cartridge, impairing the carefully prepared semiconductor surface, where such cartridge is used. I have virtually eliminated failure with shelf-life with properly prepared surfaces by using a silicone of pasty or liquid consistency to coat the crystal immediately after removal from the dehydration furnace and thus protect it permanently. While the wide variety of substances might be useful for this continued protection of the semiconductor surface, silicones of suitable consistency characteristically withstand heat so as not to vaporize during the usual electrical pulsing operation used on the wiskers for germanium crystals. Furthermore, the silicone introduces no difficulty in the soldering operation when the envelope is finally sealed. The covering of silicone is more reliable when used as a fill for the envelope. It serves also the important function of preventing even corrosive soldering flux from reaching and affecting the carefully processed semiconductor surface.

The accompanying drawings and the following detailed disclosure will promote a better appreciation of several aspects of this invention:

Figure 4:
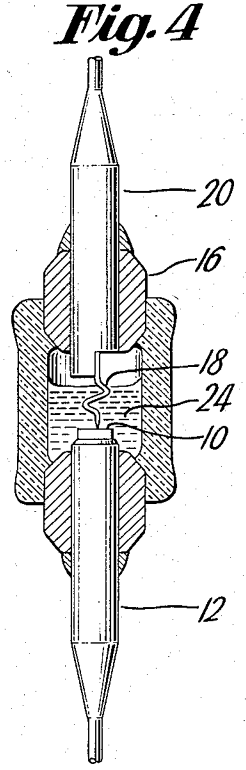

Fig. 4 illustrats a unit completed with the inclusion of this additional processing step.

Figure 1:
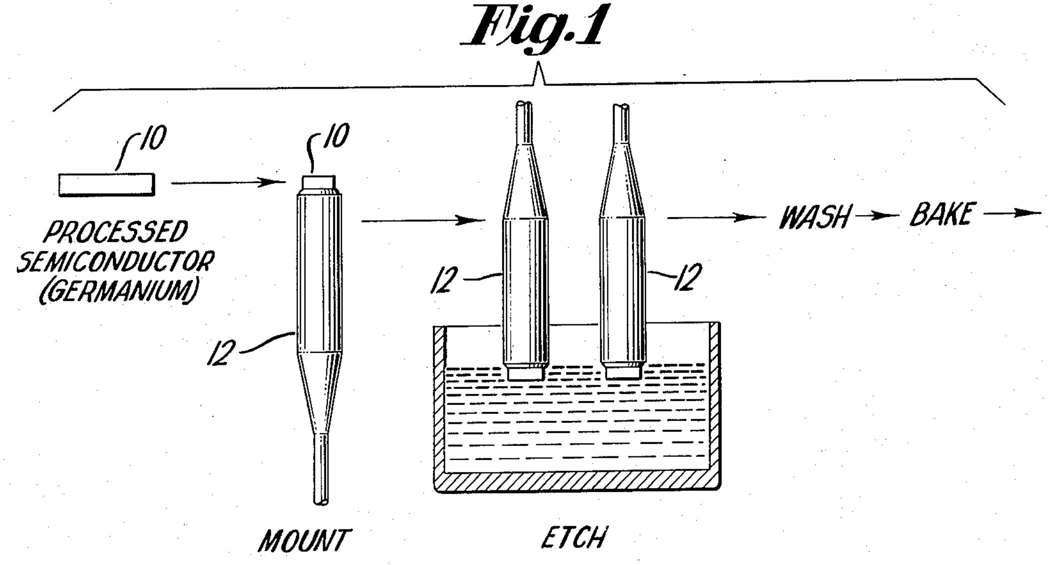
Fig. 1 is a flow diagram of the processing steps illustrating the preferred processing of semiconductor elements, particularly chips of germanium.

As shown in Fig. 1, a processed chip 10 of tin-doped germanium previously polished and etched on one surface and copper plated on the opposite surface is soldered to a pin 12 with a conventional tin-lead solder and with a zinc chloride flux. In accordance with a feature of the present invention the mounted chip is processed by immersing the chip itself and to a limited extent the pin in an etching solution such as the nitric-hydrofluoric acid and cupric nitrate solution described in Torrey & Whitmer, "Crystal Rectifiers," vol. 15 of the Radiation Laboratory series, published by McGraw Hill (1948); or it may be the etch disclosed and claimed in copending application Serial No. 106,493, filed July 23, 1949, by Frederic Koury, now abandoned. Using a potassium hydroxide solution, with the germanium anodic, is another known etching procedure. A germanium etching solution is characterized by its ability to react with the germanium and to dissolve the reaction product so as to progressively remove surface material. It also functions as a solvent or reagent for relatively insoluble fluxes such as zinc chloride.

Following the etching operation the pins are thoroughly washed in water and drained.

After the washing step, the germanium element is dried thoroughly, preferably by prolonged baking at a high temperature consistent with the heat-stability of the material and the soldered assembly. Baking, at 140° C. for a time of 18 hours is recommended, a shorter time being satisfactory with a vacuum furnace. The baking should be prolonged until the pins are needed for assembly in a complete translator, where the germanium is quickly protected from exposure to the atmosphere by the cartridge.

Figure 2:
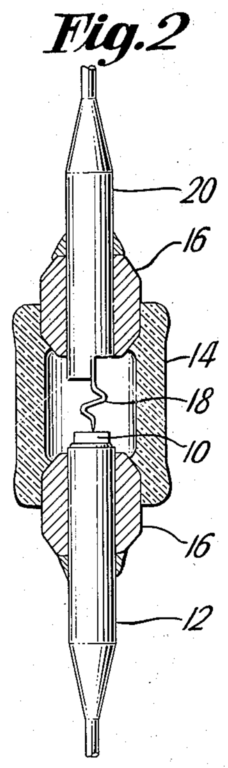
Fig. 2 illustrates a completed diode.

In Fig. 2, pin 12 is seen enclosed in a cartridge composed of a glass sleeve 14 sealed at its ends to metal fitting 16. Catwhisker 18 engages the surface of crystal 10, pin 20 carrying the catwhisker and pin 12 being soldered one after the other to members 16 as shown. Features of this construction are claimed in copending application Serial No. 74,768, filed February 5, 1949, by Ralph B. Collins, now Patent No. 2,697,805, issued December 21, 1954, Serial No. 85,518, filed April 5, 1949, by Paul E. Gates, now Patent No. 2,697,309, issued December 21, 1954, and Design No. 156,501, filed April 5, 1949, by Paul E. Gates, issued December 20, 1949.

Acording to my analysis, the processing described produces a clean and dry germanium surface; and in practice the unit of Fig. 2 constitutes a diode of excellent characteristics and long, reliable life. The small volume of atmosphere within the envelope may contain some small amount of moisture which is largely captured on the surface of the glass wall, and furthermore the final soldering operation heats this atmosphere so as to expand and drive a part of it out past the pin being soldered. Nevertheless, some small number of completed semiconductor units that are good when made fail after prolonged storage. By adding the operation represented in Fig. 3 to those in Fig. 1, the failures after storage are materially reduced.

Figure 3:
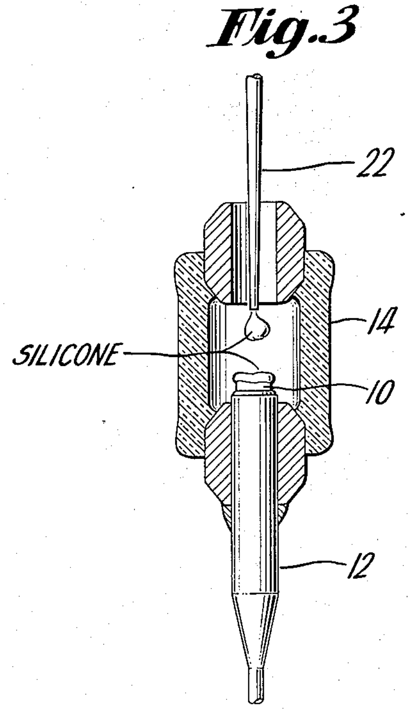
Fig. 3 illustrates an additional processing step.

Before pin 12 carrying germanium crystal 10 is inserted into the cartridge as in Fig. 3, the crystal surface is smeared with a heat-stable silicone of pasty or liquid consistency. Silicone DC–4 of the Dow-Corning Company, a mixture of several completely hydrolized siloxanes and of grease-like consistency and stable water-repellent characteristics, has been found quite suitable for the purpose. After the mounted crystal is inserted and soldered in place an additional charge of silicone is added to fill or nearly fill the space within the cartridge, conveniently with a hollow needle injector 22. Subsequently, when pin 20 bearing catwhisker 18 is inserted and brought into contact with the germanium piece 10 through the silicone mass 24, it is possible to pulse the whisker electrically without evolution of hydro-carbon decomposition products such as might react with the point-contact area in the presence of an organic coating or fill. Furthermore, it is later possible to solder pin 20 to fitting 16 with a caustic and hence reliable soldering flux without danger that this flux will deleteriously spatter the exposed crystal surface. The silicone does not vaporize or decompose at soldering temperature and apparently promotes good fluxing and soldering of the second pin in the cartridge that completes the hermetically sealed enclosure.

Various features of the invention are subject to a latitude of substitution and modification, and as indicated the final filling step may be omitted without sacrificing the special benefits of the etch-and-bake sequence of operations. The silicone fill is of special merit, but other types of fill that heretofore have been used in an effort to prevent the atmosphere from reaching imperfectly enclosed crystals can be used here as a shield against spatter of the soldering flux during the final soldering operation that completes the hermetic enclosure. Accordingly, the appended claims should be allowed that broad scope of interpretation consistent with the spirit of the invention.

What I claim is:

1. The method of producing stable germanium devices of a point-contact type which includes the steps of soldering a germanium element to a metal support, etching the exposed surface of the germanium, washing the etched and mounted germanium, then baking the mounted germanium for a prolonged period, coating the exposed germanium surface with a fluid silicone, contacting the germanium with a point-contact element projected through the silicone coating within an enclosing cartridge and simultaneously fixing the assembly of the whisker and the germanium and hermetically sealing the cartridge by a soldering operation effected with the aid of a corrosive flux that is prevented from spattering the crystal of the germanium surface by virtue of a protective silicone.

2. A semiconductor translator including an etched and dehydrated surfaced germanium element immersed in a volume of anhydrous silicone paste, a point-contact element penetrating said silicone and contacting the semiconductor, and a compact hermetically sealed enclosure maintaining the point-contact element and the semiconductor in assembly and sealing said assembly against atmospheric attack, said enclosure including a soldered seal.

3. A semiconductor translator including a body of semiconductor immersed in a volume of liquid silicone, a point-contact element penetrating said silicone and engaging said semiconductor, and an enclosure containing said silicone and maintaining said semiconductor and said point-contact element in assembly.

4. A semiconductor translator including an etched and dehydrated germanium element having a supporting terminal, a catwhisker also having a supporting terminal, said semiconductor and catwhicker being supported in mutual contact and hermetically enclosed in an envelope in which said terminals project through soldered seals, and a quantity of silicone covering the semiconductor.

5. The method of producing stable semiconductor devices of the point contact type, which includes the steps of mounting a semiconductor on a conductive support, etching the surface of the mounted semiconductor, washing and dehydrating the etched semiconductor, hermetically sealing the support in an enclosure with the semiconductor contained therein and the conductive support extending to the exterior thereof, the enclosure having an opposite aperture for receiving a point contact element, inserting a quantity of anhydrous covering for the semiconductor through that opening, inserting a point contact element and a conductive support therefor through that opening, and simultaneously fixing the point contact element in place and sealing the enclosure hermetically.

6. A semiconductor translator including a body of semiconductor, a quantity of silicone covering the exposed surface of said body, a rectifying contact element penetrating said silicone and engaging said semiconductor body, and a hermetically sealed enclosure containing said silicone, said body, and said contact.

References Cited in the file of this patent

UNITED STATES PATENTS

| | | |
|---|---|---|
| D.156,501 | Gates | Dec. 20, 1949 |
| 756,676 | Midgley | Apr. 5, 1904 |
| 2,406,405 | Salisbury | Aug. 27, 1946 |
| 2,415,841 | Ohl | Feb. 18, 1947 |
| 2,432,594 | Thompson et al. | Dec. 16, 1947 |
| 2,472,938 | Brittain et al. | June 14, 1949 |
| 2,475,940 | Brittain | July 12, 1949 |
| 2,495,716 | Girard | Jan. 31, 1950 |
| 2,577,803 | Pfann | Dec. 11, 1951 |
| 2,583,009 | Olsen | Jan. 22, 1952 |
| 2,602,211 | Scaff et al. | July 8, 1952 |

FOREIGN PATENTS

| | | |
|---|---|---|
| 623,942 | Great Britain | Dec. 5, 1949 |